United States Patent
Song et al.

(10) Patent No.: US 9,640,512 B2
(45) Date of Patent: May 2, 2017

(54) WIRE BONDING APPARATUS COMPRISING AN OSCILLATOR MECHANISM

(71) Applicant: ASM Technology Singapore Pte Ltd, Singapore (SG)

(72) Inventors: Keng Yew Song, Singapore (SG); Ka Shing Kwan, Singapore (SG); Yue Zhang, Singapore (SG); Yan Dong Sun, Singapore (SG); Xiao Liang Chen, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 14/803,314

(22) Filed: Jul. 20, 2015

(65) Prior Publication Data

US 2016/0023298 A1 Jan. 28, 2016

Related U.S. Application Data

(60) Provisional application No. 62/028,381, filed on Jul. 24, 2014.

(51) Int. Cl.
*B23K 31/00* (2006.01)
*B23K 31/02* (2006.01)
(Continued)

(52) U.S. Cl.
CPC ............ *H01L 24/85* (2013.01); *B23K 20/005* (2013.01); *H01L 24/78* (2013.01); *H01L 2224/78301* (2013.01); *H01L 2924/00014* (2013.01)

(58) Field of Classification Search
CPC ........ H01L 2224/78301; H01L 2224/85; H01L 2224/85148; B23K 20/005; B23K 20/10; B23K 20/004; B23K 20/106
(Continued)

(56) References Cited

U.S. PATENT DOCUMENTS 8,919,631 B2   12/2014   Wong et al.
2007/0257083 A1*  11/2007   Narasimalu ............... B06B 3/00
                                                              228/1.1
(Continued)

FOREIGN PATENT DOCUMENTS

KR   10-2011-0033854   3/2011
KR   10-2013-0105503   9/2013

OTHER PUBLICATIONS

Korean Notification of Reason for Refusal mailed May 10, 2016 in corresponding Korean Patent Application No. 10-2015-0104142, along with an English translation thereof.

*Primary Examiner* — Erin Saad
(74) *Attorney, Agent, or Firm* — Ostrolenk Faber LLP (57) ABSTRACT

A wire bonding apparatus comprises an ultrasonic transducer including a capillary, a flexible connecting frame having a first side to which the ultrasonic transducer is connected and at least one electrically-driven actuator which is connected to a second side of the flexible connecting frame that is opposite to the first side thereof, the actuator having a longitudinal actuation direction. An elongated slit located in the flexible connecting frame extends substantially transversely to the actuation direction of the at least one actuator to form at least one pivot point adjacent to an end of the slit about which the flexible connecting frame is rotatable when it is driven by the at least one actuator.

20 Claims, 7 Drawing Sheets

(51) Int. Cl.
*H01L 23/00* (2006.01)
*B23K 20/00* (2006.01)

(58) Field of Classification Search
USPC ...................................... 228/180.5, 4.5, 904
See application file for complete search history.

(56) References Cited

U.S. PATENT DOCUMENTS

| | | | |
|---|---|---|---|
| 2011/0226838 A1 | 9/2011 | Aoyagi et al. | 228/102 |
| 2013/0240605 A1* | 9/2013 | Wong | H01L 24/78 |
| | | | 228/1.1 |

* cited by examiner

SECTION A-A

SECTION B-B

WIRE BONDING APPARATUS COMPRISING AN OSCILLATOR MECHANISM

FIELD OF THE INVENTION

This invention relates to a wire bonder for forming electrical interconnections between different locations on an electronic device which includes a semiconductor die.

BACKGROUND AND PRIOR ART

In the prior art, transducer mounting structures are disclosed which comprise different types of arrangements of electrically-driven actuators. The arrangements of these actuators are dictated by the functions of different transducer mounting designs and control procedures.

An example of a prior art transducer mounting structure is disclosed by U.S. Pat. No. 8,919,631 entitled "Wire Bonder Including a Transducer, a Bond Head, and a Mounting Apparatus". The patent discloses an apparatus for mounting a transducer to a bond head of a wire bonder, wherein the bond head of the wire bonder is operative to mechanically drive the transducer when forming electrical interconnections between separate locations within a semiconductor package. Specifically, the apparatus comprises a flexural structure having a connector for connecting to the transducer, the flexural structure being configured to bend, and actuators attached to the flexural structure. The actuators are operative to bend the flexural structure to thereby cause a displacement of the transducer connected thereto via the connector.

In the aforesaid transducer mounting structure, the ultrasonic vibration of the transducer will be influenced by the oscillation of their electrically-driven actuators since the actuators are fixed directly to the transducer. For instance, if the transducer assembly is fixed to the actuators vertically, this will generate relatively large vertical vibrations, which has the effect of damaging the surface of a die being bonded and thereby affect the bonding quality, especially for sensitive electronic devices.

There is no specific clamping portion configured on the aforesaid transducer to securely fix the actuators. Since the oscillatory stroke of most actuators such as piezoelectric actuators are only several microns in length, this stroke is typically magnified by the oscillating mounting structure to thereby increase the amplitude of vibration at a capillary near a tip of the transducer. If the clamping of the actuators is not secure enough, the strokes transmitted from the actuators to the mounting structure may be weakened, and in turn significantly affect the amplitude of vibration at the capillary. Moreover, if only epoxy is used to glue the actuators onto a support portion of the transducer, the epoxy would not only absorb the stroke of the actuator, but would also generate a gap between the actuators and their support portion during extension or contraction. This gap that is created may alter the positions of the actuators, and may even cause them to be dislodged from the support portion.

SUMMARY OF THE INVENTION

It is thus an object of the invention to seek to provide a wire bonding apparatus including electrically-driven actuators in a transducer which securely clamps the actuators and allows oscillatory actuation of the transducer in non-linear directions.

Accordingly, the invention provides a wire bonding apparatus comprising: an ultrasonic transducer including a capillary; a flexible connecting frame having a first side to which the ultrasonic transducer is connected; at least one electrically-driven actuator which is connected to a second side of the flexible connecting frame that is opposite to the first side thereof, the actuator having a longitudinal actuation direction; and an elongated slit located in the flexible connecting frame which extends substantially transversely to the actuation direction of the at least one actuator to form at least one pivot point adjacent to an end of the slit about which the flexible connecting frame is rotatable when it is driven by the at least one actuator.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Preferred embodiments of the invention will be described, by way of example only, with reference to the accompanying drawings, of which.

DETAILED DESCRIPTION OF THE PREFERRED EMBODIMENTS

Figure 1:
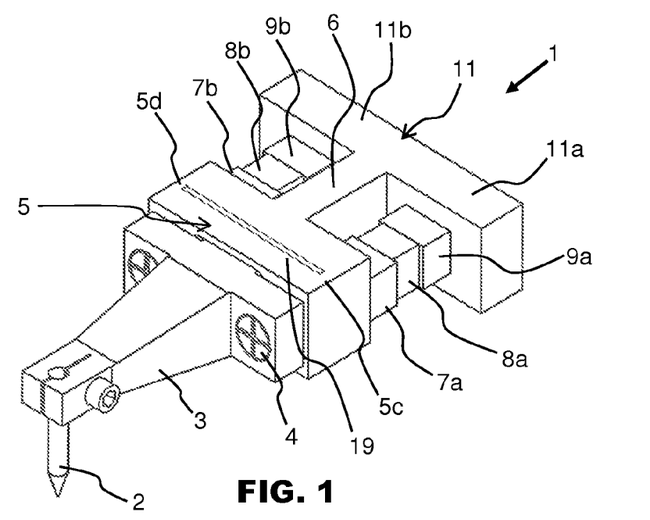
FIG. 1 is a perspective view of a mounting apparatus comprising an oscillator according to a first preferred embodiment of the invention.

FIG. 1 is a perspective view of a mounting apparatus 1 comprising an oscillator according to a first preferred embodiment of the invention.

The mounting apparatus 1 is operative to attach an ultrasonic transducer 3 including a capillary 2 near its tip to a bond head of a wire bonder (not shown). The ultrasonic transducer 3 is attached to the mounting apparatus 1 via screws 4. A flexible connecting frame 5 having a first side to which the ultrasonic transducer 3 is attached via the screws 4 that are inserted into the first side of the flexible connecting frame 5 provides a flexible structure to ensure smooth oscillatory motion of the mounting apparatus 1 during wire bonding. There are pivot points 5c, 5d in the flexible connecting frame 5, each of which is defined adjacent to respective ends of an elongated slit 19 in the flexible connecting frame 5 which extends laterally in directions that are substantially transverse to respective actuation directions of at least one stack of electrically-driven actuators. The stack of electrically-driven actuators may be in the form of piezoelectric actuators 8a, 8b which have longitudinal actuation directions and cause oscillatory motion of the mounting apparatus 1.

The piezoelectric actuators 8a, 8b are connected to a second side of the flexible connecting frame 5 opposite to the first side thereof, and the flexible connecting frame 5 is rotatable about the pivot points 5c, 5d when it is driven by the piezoelectric actuators 8a, 8b. The pivot points 5c, 5d will also serve to insulate against interference by each set of piezoelectric actuators 8a, 8b on the other, both in relation to the mounting apparatus 1 and to the transducer 3 at various operational frequencies and stroke amplitudes.

A flexible central beam 6 that extends substantially parallel to the actuation direction of the piezoelectric actuators 8a, 8b is configured to connect the flexible connecting frame 5 to a base portion 11 of the mounting apparatus 1. The two piezoelectric actuators 8a, 8b are located on opposite sides of the central beam. A first flexible support 7a, 7b is located on each side of the central beam 6 to support one end of each stack of piezoelectric actuators 8a, 8b. At another end of each stack of piezoelectric actuators 8a, 8b, there is a second flexible support 9a, 9b to support the other end of the stack of piezoelectric actuators 8a, 8b. All the four flexible supports 7a, 7b, 9a, 9b are made pivotable to allow the piezoelectric actuators 8a, 8b to be rotatable relative to the base portion. The flexible supports may be designed as slidable or flexible deformable structures fixed to the flexible connecting frame 5 and the base portion 11 respectively.

The piezoelectric actuators 8a, 8b may be driven at a certain frequency, such as between 100 Hz and 200 kHz, to provide a transverse scrubbing amplitude of several microns at the capillary 2. The base portion 11 has a higher rigidity than the flexible connecting frame 5, to enable the flexible connecting frame 5 to be rotatable relative to the base portion. Thus, the structure of the base portion 11 should be designed strong enough to ensure that most of the stroke generated by each stack of piezoelectric actuators 8a, 8b is transmitted to the flexible connecting frame 5 and the central beam 6 instead of to the bond head. As a result of the elastic deformation of the flexible connecting frame 5 and the central beam 6, an oscillatory motion which is substantially transverse to the vibration directions of the piezoelectric actuators 8a, 8b and a longitudinal axis of the transducer 3 is realizable at the tip of the capillary 2 for performing wire bonding.

Figure 2A:
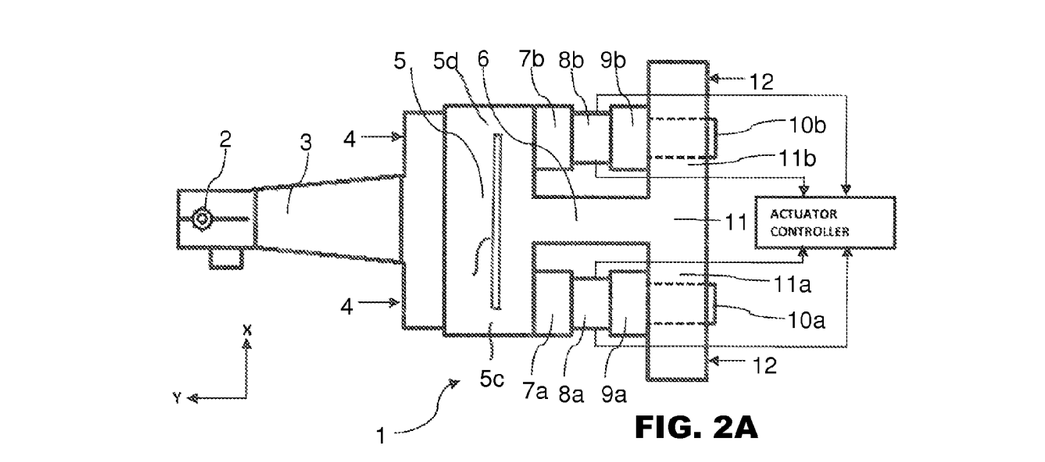
FIGS. 2A and 2B are plan and end views respectively of the mounting apparatus of FIG. 1.
Figure 2B:
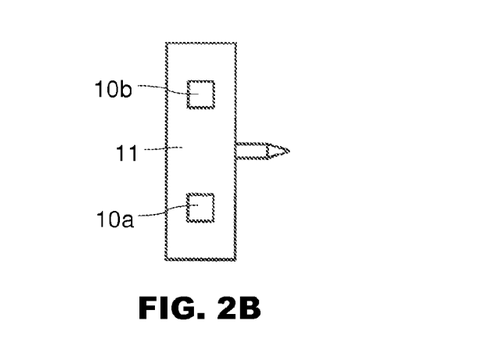

FIGS. 2A and 2B are plan and end views respectively of the mounting apparatus 1 of FIG. 1. In particular, vibratory motion of the piezoelectric actuators 8a, 8b is controllable by an actuator controller which is connected to the respective piezoelectric actuators 8a, 8b. Further, two variable-thrust units in the form of preload screws 10a, 10b are fixed onto opposite sides 11a, 11b of the base portion 11 corresponding to positions where the piezoelectric actuators 8a, 8b are mounted to generate preload forces against the flexible supports 9a, 9b. Such preload forces are operative to clamp the piezoelectric actuators 8a, 8b towards the flexible connecting frame 5 with a required preload force to secure the same and to ensure reliable operation of the mounting apparatus 1.

Figure 3:
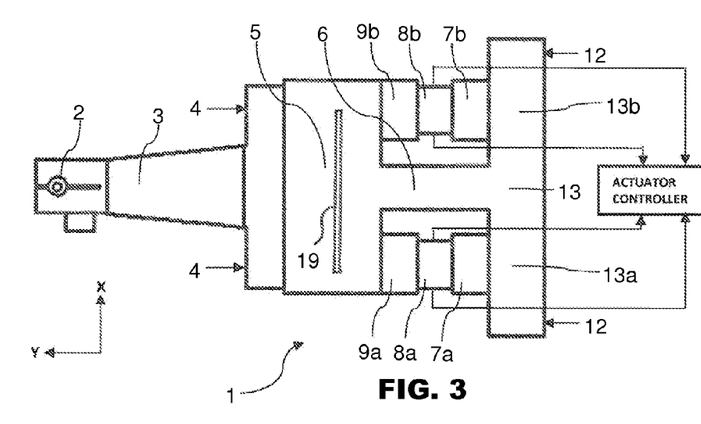
FIG. 3 is a plan view of a mounting apparatus comprising an oscillator according to a second preferred embodiment of the invention.
Figure 4:
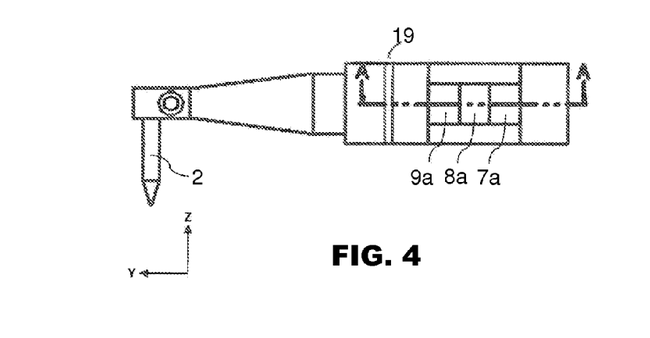
FIG. 4 is a side view of the mounting apparatus of FIG. 3.

FIG. 3 is a plan view of a mounting apparatus 1 comprising an oscillator according to a second preferred embodiment of the invention. FIG. 4 is a side view of the mounting apparatus of FIG. 3. Similar to the first preferred embodiment, the ultrasonic transducer 3 is also mounted to the mounting apparatus via screws 4. However, there is a base portion 13 which is not adapted to receive preload screws 10a, 10b at opposite sides 13a, 13b of the base portion 13.

Figure 5:
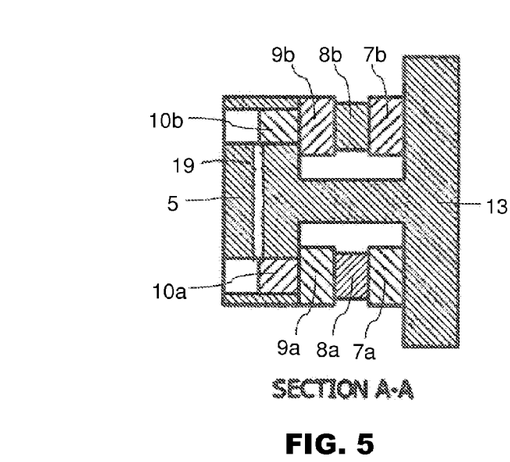
FIG. 5 is a cross-sectional view of the mounting apparatus according to the second preferred embodiment of the invention looking from section A-A of FIG. 4.

Instead, as shown in FIG. 5 which is a cross-sectional view of the mounting apparatus 1 looking from section A-A of FIG. 4, the two preload screws 10a, 10b in this embodiment are located on the flexible connecting frame 5. The positions of the first and second flexible supports 7a, 7b, 9a, 9b should be reversed to be configured to match with the positions of the preload screws 10a, 10b located in the flexible connecting frame 5 to provide clamping forces onto the piezoelectric actuators 8a, 8b towards the base portion 13. The strokes of the piezoelectric actuators 8a, 8b are similarly transmitted to the flexible connecting frame 5 and central beam 6 when the piezoelectric actuators 8a, 8b are driven to oscillate, with support from the relative stiffness of the base portion 13.

Figure 6A:
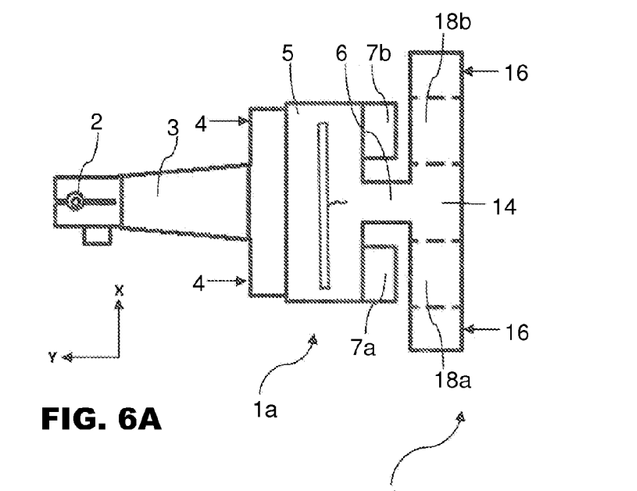
FIGS. 6A to 6C are plan and end views of a mounting apparatus comprising an oscillator according to a third preferred embodiment of the invention wherein an oscillator portion is separable from a transducer portion of the mounting apparatus.
Figure 6B:
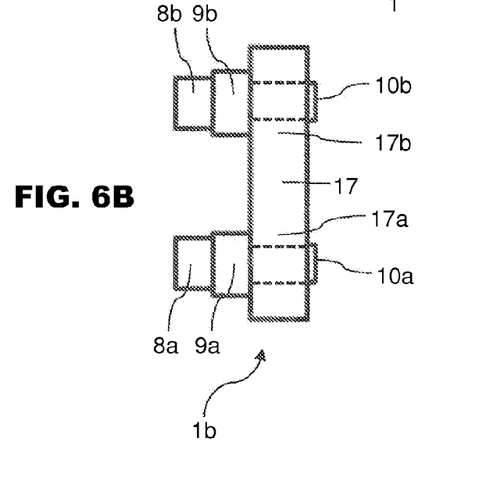
Figure 6C:
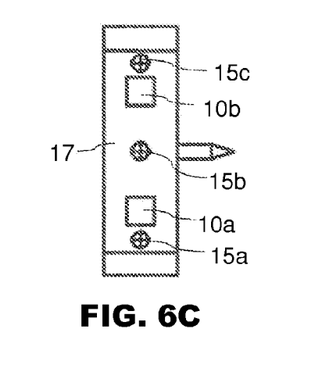

FIGS. 6A to 6C are plan and end views of a mounting apparatus 1 comprising an oscillator according to a third preferred embodiment of the invention. In this embodiment, an oscillator portion 1b of the mounting apparatus 1, comprising the piezoelectric actuators 8a, 8b, second flexible supports 9a, 9b, and rear back base portion 17, 17a, 17b, is configured to be detachably mounted to and hence separable from a transducer portion 1a of the mounting apparatus 1. The transducer portion 1a generally comprises the ultrasonic transducer 3, flexible connecting frame 5 and a front base portion 14. There are through-holes 18a, 18b in the front base portion 14 of the transducer portion 1a for receiving the separated piezoelectric actuators 8a, 8b and flexible supports 9a, 9b during assembly of the mounting apparatus 1. In use, the mounting apparatus 1 is attached to the bond head at its mounting ends 16.

Accordingly, the central beam 6 is shortened and the additional front base portion 14 is adapted to connect the oscillator portion 1b to the transducer portion 1a. As the central beam 6 is shortened, a distance between the capillary 2 and the mounting ends 16 of the mounting apparatus 1 is reduced. Preferably, it is possible to hide the rear base portion 17, 17a, 17b into a cavity formed in the front base portion 14 when attaching the rear base portion 17 to the front base portion 14. As the ultrasonic transducer 3 has to work under high temperatures, the shortened structure may facilitate a reduction in the effects of thermal expansion, and hence improve the bonding quality As seen in FIG. 6C, the rear base portion 17 has screw openings at its side for receiving screws 15a, 15b, 15c to attach the rear base portion 17 to the front base portion 14 to complete the assembly of the mounting apparatus 1.

Figure 7:
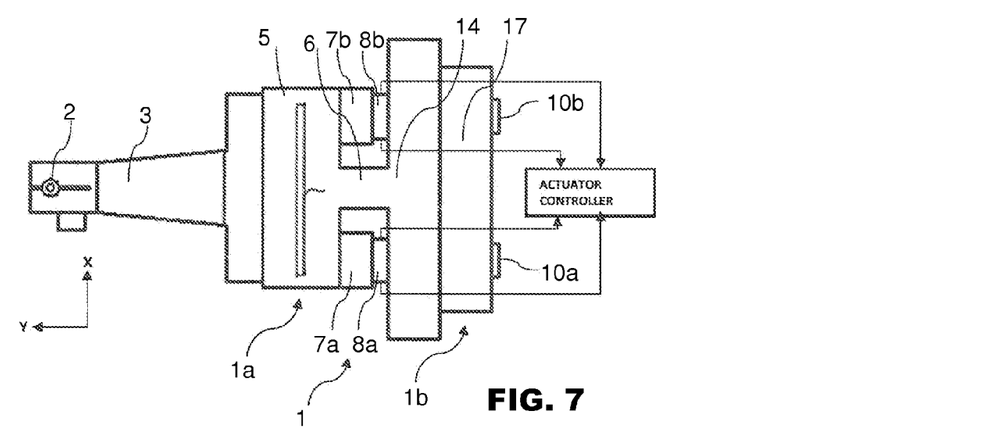
FIG. 7 is a plan view of the mounting apparatus of FIGS. 6A and 6B when its oscillator portion is connected to its transducer portion.
Figure 8:
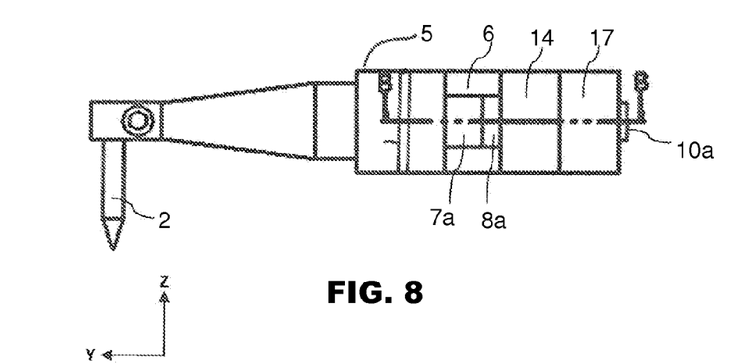
FIG. 8 is a side view of the mounting apparatus of FIG. 7.

FIG. 7 is a plan view of the mounting apparatus 1 of FIGS. 6A and 6B when its oscillator portion 1b is connected to its transducer portion 1a. FIG. 8 is a side view of the mounting apparatus 1 of FIG. 7.

Figure 9:
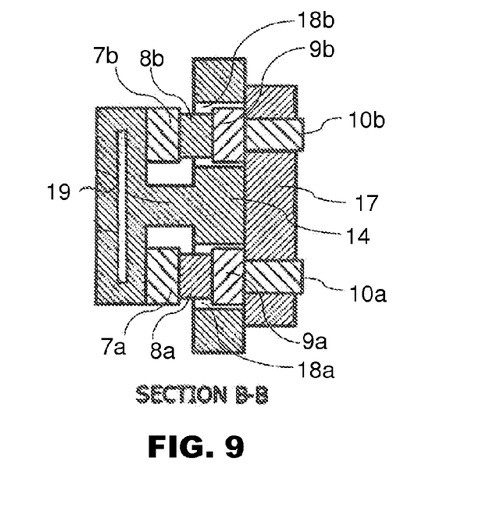
FIG. 9 is a cross-sectional view of the mounting apparatus according to the third preferred embodiment of the invention looking from section B-B of FIG. 8.

FIG. 9 is a cross-sectional view of the mounting apparatus according to the third preferred embodiment of the invention looking from section B-B of FIG. 8. As shown more clearly in FIG. 9, there are two through-holes 18a, 18b on the front base portion 14 to provide space for the piezoelectric actuators 8a, 8b and the second flexible supports 9a, 9b to be inserted. The preload screws 10a, 10b are then inserted to clamp the piezoelectric actuators 8a, 8b securely.

It is preferred that each preload screw 10a, 10b is aligned between a pair of the mounting screws 15a, 15b, 15c (see FIG. 6C) to reduce the vibration transmitted from the piezoelectric actuators 8a, 8b onto the front and rear base portions 14, 17, and thereby ensure that most of the oscillatory strokes generated by the piezoelectric actuators 8a, 8b are transmitted directly to the flexible connecting frame 5. In addition, it should be noted that the positions of the second flexible supports 9a, 9b and the preload screws 10a, 10b may also be located onto the flexible connecting frame 5 as in the second preferred embodiment, instead of on the rear base portion 17, 17a, 17b.

FIGS. 10A to 10F illustrate various alternative designs of flexible connecting frames 5 which are useable with the mounting apparatus 1 according to the preferred embodiments of the invention.

Figure 10A:
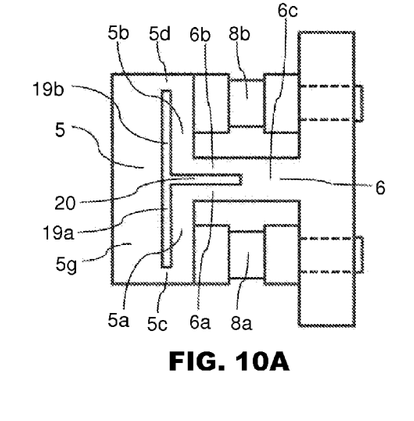
FIGS. 10A to 10F illustrate various alternative designs of flexible connecting frames which are useable with the mounting apparatus according to the preferred embodiments of the invention.
Figure 10B:
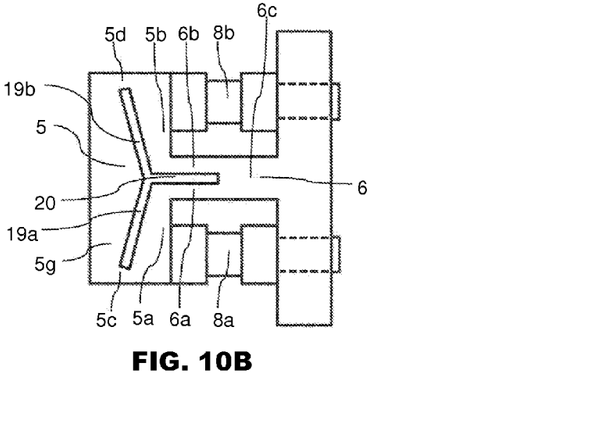
Figure 10C:
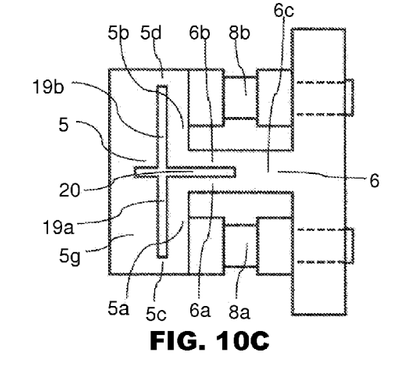

FIGS. 10A, 10B and 10C show a first set of possible flexible connecting frame 5 designs. In these designs, the pivot points 5c, 5d are configured by the ends of a slit 19a, 19b extending in a direction that is substantially perpendicular to the deformation directions of the piezoelectric actuators 8a, 8b. An additional slit 20, which is connected to a point on the slit 19a, 19b (generally at a midpoint of the slit 19a, 19b) and substantially parallel to the actuation directions of the actuators 8a, 8b, separates the central beam 6 into two opposing flexible beams 6a, 6b, which are further connected to an unseparated flexible beam base 6c.

Two opposing flexible arms 5a, 5b that correspond to the opposing flexible beams 6a, 6b, and the flexible beams 6a, 6b, will rotate together when the piezoelectric actuators 8a, 8b are driven to oscillate with a suitable control program. The flexible arms 5a, 5b will further rotate about the corresponding pivot points 5c, 5d at the same time. Therefore, the linear deformation of piezoelectric actuators 8a, 8b along a longitudinal axis parallel to the ultrasonic transducer 3 will be absorbed by the flexible connecting frame 5. Hence, resultant deformations that are transmitted from the piezoelectric actuators 8a, 8b to the mounting apparatus 1 and the ultrasonic transducer 3 are reduced.

A bridge portion 5g connects the two mounting positions of the screws 4 to each other, such that the ultrasonic transducer 3 may oscillate along with the mounting apparatus 1 transversely to the deformation directions of the piezoelectric actuators 8a, 8b at a particular frequency to provide oscillation at the tip of the capillary 2. Moreover, the end of each slit 19a, 19b, 20 is not limited to sharp corners only, but may also include a fillet or other more complex structure to adjust the distribution of stress and strain.

Figure 10D:
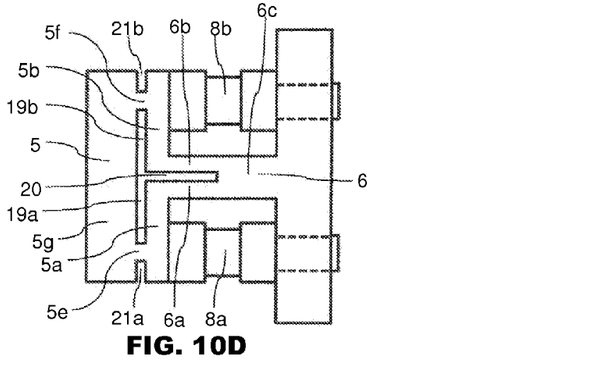
Figure 10E:
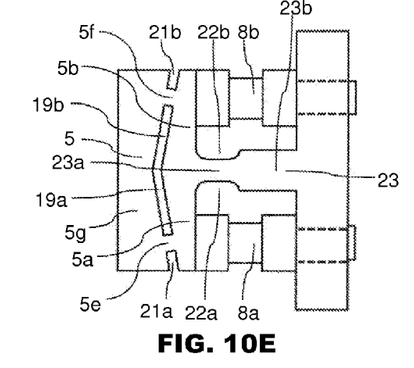
Figure 10F:
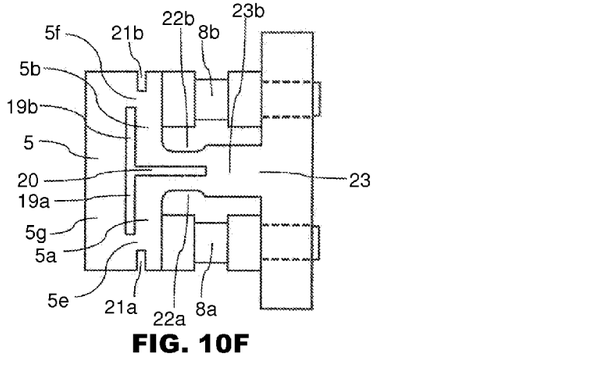

FIGS. 10D, 10E and 10F show a second set of possible flexible connecting frame 5 designs. The main difference between the first and second sets of flexible connecting frame 5 designs are additional pivot points 5e, 5f in the second set of designs that are configured by the end of the slit 19a, 19b and peripheral slits 21a, 21b extending from opposite edges of the flexible connecting frame 5 generally in the direction of the slit 19a, 19b. The peripheral slits 21a, 21b may also be generally arranged in directions which are substantially perpendicular or angular to deformation directions of the piezoelectric actuators 8a, 8b. Compared with the first set of designs, the additional pivot points 5e, 5f of the second set of designs are created between opposite ends of the slit 19a, 19b and corresponding ends of the peripheral slits 21a, 21b, and the additional pivot points may be located at any other position except at the corners of the flexible connecting frame 5. The positions of the peripheral slits 21a, 21b may also be aligned at different positions relative to the slits 19a, 19b, as shown in FIGS. 10E and 10F.

In FIG. 10E, the flexible connecting frame 5 comprises a pair of flexible arms 5a, 5b, pivot points 5e, 5f and a bridge portion 5g. The flexible arms 5a, 5b are connected to each other by a narrowed central beam 23a which is configured by cut-outs 22a, 22b made on a central beam 23 at an end of the central beam 23 connected to the flexible connecting frame 5 to form another pivot for transverse oscillation of the flexible connecting frame 5. The central beam 23 also comprises a central beam base 23b. The pivot points 5e, 5f are similar to those found on the design in FIG. 10D. The flexible material around the intersection of the flexible arms 5a, 5b and the central beam 23a forms a rotatable pivot for transverse oscillating motion of the mounting apparatus 1.

FIG. 10F shows a rotatable pivot where both the slit 20 and the cut-outs 22a, 22b are arranged to configure the rotatable pivot. However, as mentioned above, it should be appreciated that the illustrated designs are only meant as examples, and other flexural structures which are operative to generate elastic deformation are also possible.

FIGS. 11A to 11E illustrate various alternative designs of flexible supports 7, 9 which are useable with the mounting apparatus 1 according to the preferred embodiments of the invention.

Figure 11A:
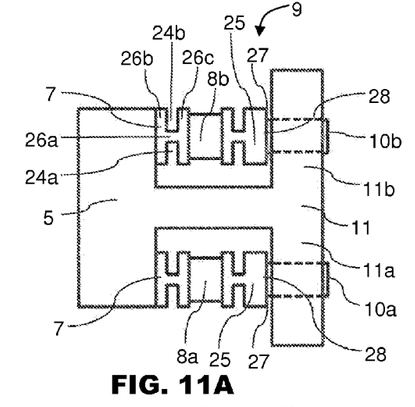
FIGS. 11A to 11E illustrate various alternative designs of flexible supports which are useable with the mounting apparatus according to the preferred embodiments of the invention.

In the design of FIG. 11A, each of the first flexible supports 7 comprises a pair of cut-outs 24a, 24b, a support base 26b adjacent to the flexible connecting frame 5, an actuator support 26c adjacent to one end of the piezoelectric actuator 8a, 8b and a pivotal axis 26a located on a beam connecting the support base 26b and the actuator support 26c. The piezoelectric actuators 8a, 8b will rotate slightly along with rotation of the flexible supports 7 about the pivotal axis 26a when the two stacks of piezoelectric actuators 8a, 8b drive the transverse oscillatory motion of the flexible connecting frame 5.

On the other side of the piezoelectric actuators 8a, 8b, there are two second flexible supports 25 that have similar structures as the first flexible support 7. In other words, each of the second flexible supports 25 comprises a second actuator support adjacent to an opposite end of each piezoelectric actuator 8a, 8b, a second support base adjacent to the base portion 11, and a second pivotal axis located on a second beam connecting the second actuator support and the second support base. The preload screws 10a, 10b provide pushing forces to push the second flexible supports 25 in the direction of the piezoelectric actuators 8a, 8b to securely clamp the piezoelectric actuators 8a, 8b. There may be small gaps 27 formed between contact surfaces 28 of the second flexible supports 25 and the sides 11a, 11b of the base portion 11 due to the application of the said pushing forces. However, the gaps 27 could be filled by wedges to fix the positions of the second flexible supports 25.

Figure 11B:
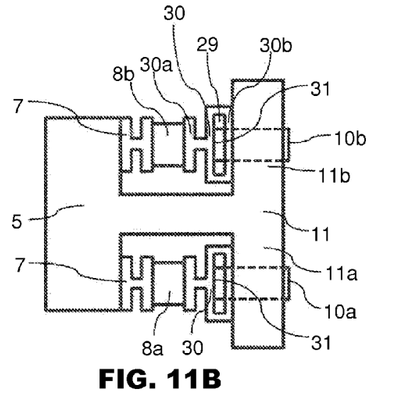

In the design illustrated in FIG. 11B, the second flexible supports 30 have structures that are similar to the first flexible support 7, but with an additional slit 29 extending in a direction perpendicular to the force-application direction of the preload screws 10a, 10b. When the preload screws 10a, 10b push against contact surfaces 31 of the rear flexible portions 30b of the second flexible supports 30, front flexible portions 30a of the second flexible supports 30 may continue to move towards the piezoelectric actuators 8*a*, 8*b* as a result of deformation of the rear flexible portions 30*b* around the contact surfaces 31. The deformation of the rear flexible portions 30*b* of the second flexible supports 30 are operative to generate an opposite reaction force to the preload screws 10*a*, 10*b* to prevent the loosening of the preload screws 10*a*, 10*b* under high frequency vibration.

Figure 11C:
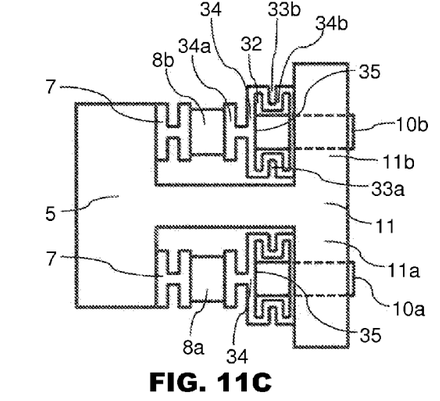

In the design of FIG. 11C, the second flexible support 34 comprises a pair of side slits 33*a*, 33*b*, a front flexible portion 34*a* connected to the second beam with a structure which is similar to that of the first flexible support 7, a rear flexible portion 34*b* connected to the base portion 11, and a "H"-shaped slit 32 that is located between the front and rear flexible portions 34*a*, 34*b*. Deformation of the "H"-shaped slit 32 serves to limit any torsional deformation generated by screw rolling. The second support base has a contact surface 35 for the application of a preload force to clamp the second flexible support 34 and the piezoelectric actuator 8*a*, 8*b*. Accordingly, substantially linear deformation will be achieved when the preload screws 10*a*, 10*b* are tightened against the front flexible portions 34*a* to securely clamp the piezoelectric actuators 8*a*, 8*b*. Compared with the design of the second flexible supports 30 in FIG. 11B, the elasticity of the rear flexible portions 34*b* is improved, but the opposite reaction force is lower. In order to avoid the loosening of the preload screws 10*a*, 10*b*, several anti-loosening structures as described in relation to FIGS. 12A to 12C may be adopted.

Figure 11D:
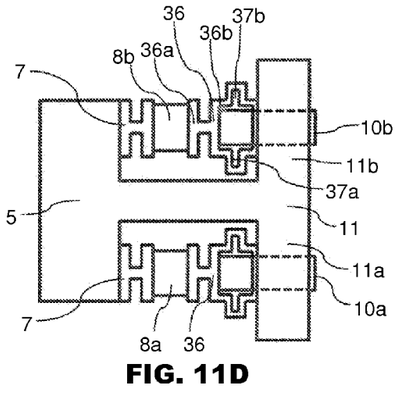

In the design illustrated in FIG. 11D, the main difference between the design of the second flexible support 36 and the design of FIG. 11C is the addition of a cross-shaped slit 37*a*, 37*b*. There is similarly a front flexible portion 36*a* and a rear flexible portion 36*b* incorporated in the flexible support 36.

Figure 11E:
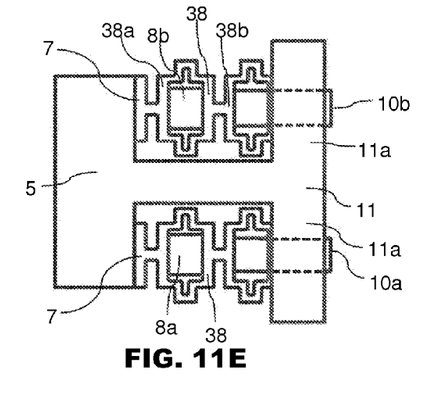

FIG. 11E shows another design of the second flexible support 38. This design integrates a structure similar to that used for the first flexible support 7, a first flexible actuator bracket 38*a* and second flexible actuator bracket 38*b*, which together increase the total stiffness of the oscillator portion 1*b*. The shapes of the first flexible actuator bracket 38*a* and second actuator bracket 38*b* are similar to that of the rear flexible portions 36*b* found in the design of FIG. 11D.

It should be appreciated that any other flexible structures may also be utilized to clamp the piezoelectric actuators 8*a*, 8*b*. As mentioned above, the illustrated designs are only meant as examples, and other flexible structures with pivotable features which are capable of generating rotatable elastic deformation are also possible. It is also possible to design flexible supports for the piezoelectric actuators 8*a*, 8*b* without flexible or pivotable structures.

Figure 12A:
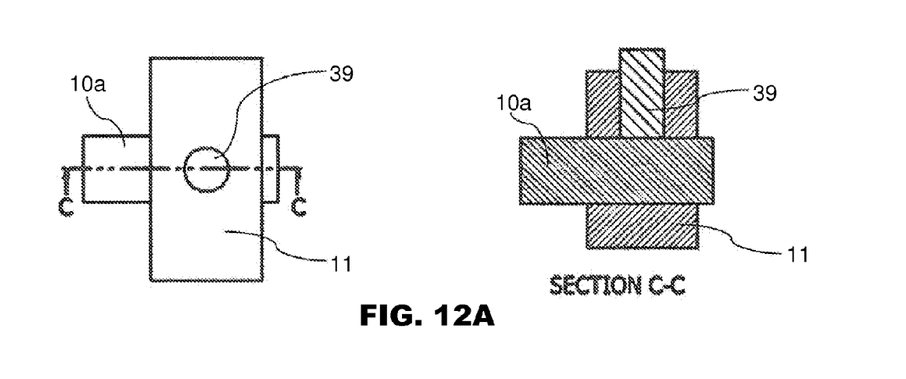
FIGS. 12A to 12C illustrate various possible structures for applying retaining forces onto preload screws to resist their loosening.
Figure 12B:
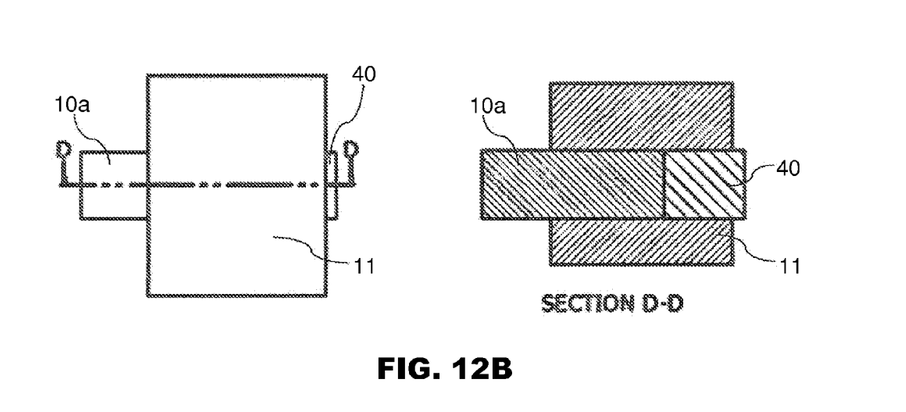
Figure 12C:
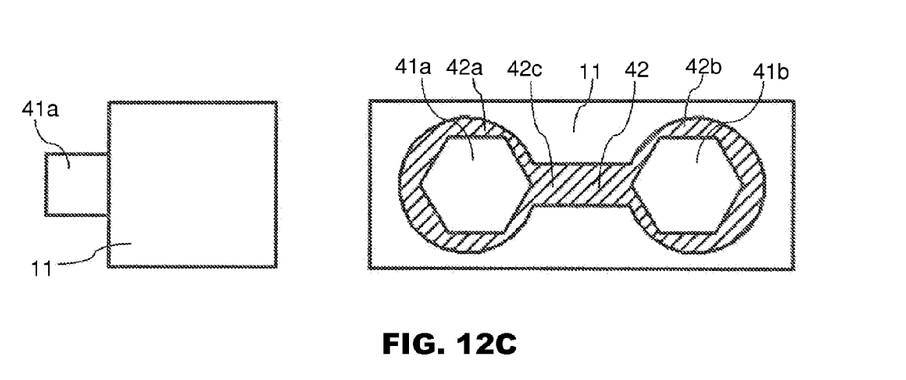

FIGS. 12A to 12C illustrate various possible structures for applying retaining forces onto the preload screws 10*a*, 10*b* to resist their loosening. FIG. 12A is a first exemplary anti-loosening design for the preload screws 10*a*, 10*b*. A locking unit 39 is insertable into the base portion 11 perpendicular to the preload screw 10*a* to stop it from loosening. FIG. 12B is a second exemplary anti-loosening design wherein a locking unit 40 is inserted behind the preload screw 10*a* to prevent the preload screw 10*b* from loosening.

FIG. 12C is a third exemplary anti-loosening design including a groove 42 comprising two blind holes 42*a*, 42*b* and a cut-out 42*c* connecting the blind holes 42*a*, 42*b*. A high strength epoxy or any other curable filling compound is filled into the groove 42 to connect the two preload screws 10*a*, 10*b* to each other, and to prevent the preload screws 10*a*, 10*b* from loosening under high frequency vibration. Screw holes for the preload screws 10*a*, 10*b* are preferably non-coaxial with the blind holes 42*a*, 42*b* into which the preload screws 10*a*, 10*b* are inserted. The heads 41*a*, 41*b* of the preload screws 10*a*, 10*b* are preferably non-circular, and may have shapes such as hexagon, square shapes. After curing, the filling compound will conform to the preload screws 10*a*, 10*b*, side walls of the blind holes 42*a*, 42*b* and the connecting cut-out 42*c* so as to further restrict any rotation of the preload screws 10*a*, 10*b* embedded in the filling compound. However, as mentioned above, the illustrated designs are only meant as examples, and other anti-loosening structures which could limit the position of the preload screws 10*a*, 10*b* are also possible.

As compared with bonding results achieved using conventional transducers, the oscillatory wire bonding apparatus according to the preferred embodiments of the invention is capable of generating stable and consistent multi-linear and transverse scrubbing motions by the cooperation between the two piezoelectric actuators 8*a*, 8*b* on the oscillator portion 1*b* of the mounting apparatus 1. This design provides not only variable amplitudes at the capillary, but is also operative to generate vibration at a variety of frequencies. The design also makes it possible to fulfill the requirements of different kinds of bonding wires and devices, and thereby efficiently improves the cleaning of die pad surfaces during bonding, and also improves the adhesion of ball bonds onto die pad surfaces.

Since the transducer portion 1*a* is fixed to the oscillator portion 1*b* horizontally, the oscillator portion 1*b* can be designed symmetrically. Accordingly, the oscillating structure may remove any additional impact generated by the oscillator portion 1*b* in vertical directions during cleaning of the die pad surface and when bonding a wire onto the die pad surface. The clamping of the piezoelectric actuators 8*a*, 8*b* by the flexible supports 7, 9 may further effectively guarantee the amplitude of oscillating motion at the capillary 2. Moreover, the reliable anti-loosening structures prevent the clamping structure from loosening, and thereby better ensure the stability and durability of the oscillator.

It should be appreciated that the structure of the mounting apparatus 1 is compatible with other electrically-driven actuators besides the piezoelectric actuators 8*a*, 8*b* described in relation to the preferred embodiments of the invention, such as actuators with electromagnetic, electrostatic, thermomechanical, phase change, shape memory, magnetostrictive, electrorheological, electrohydrodynamic, diamagnetism properties and so on. The shape of the electrically-driven actuators may be square, round, ring-shaped or comprise any other geometrical shape.

The invention described herein is susceptible to variations, modifications and/or addition other than those specifically described and it is to be understood that the invention includes all such variations, modifications and/or additions which fall within the spirit and scope of the above description.

The invention claimed is:

1. A wire bonding apparatus comprising:
    an ultrasonic transducer including a capillary;
    a flexible connecting frame having a first side to which the ultrasonic transducer is connected;
    at least one electrically-driven actuator which is connected to a second side of the flexible connecting frame that is opposite to the first side thereof, the actuator having a longitudinal actuation direction; and
    an elongated slit, located in the flexible connecting frame, which extends substantially transversely to the actuation direction of the at least one actuator, the elongated slit having an entire length extending substantially transversely to the actuation direction of the at least one actuator, the entire length of the elongated slit being bounded by planar surfaces of the flexible connecting frame, the planar surfaces of the flexible connecting frame and the elongated slit extending through an entire thickness of the flexible connecting frame, the entire thickness of the flexible connecting frame extending between a third side of the flexible connecting frame and a fourth side of the flexible connecting frame, the entire thickness of the flexible connecting frame extending in a first direction perpendicular to a second direction between the first side of the flexible connecting frame and the second side of the flexible connecting frame, the third side of the flexible connecting frame defining a top of the flexible connecting frame in the first direction and the fourth side of the flexible connecting frame defining a bottom of the flexible connecting frame in the first direction, a portion of the flexible connecting frame not including the elongated slit being configured to form at least one pivot point adjacent to an end of the slit about which the flexible connecting frame is rotatable when it is driven by the at least one actuator.

2. The wire bonding apparatus as claimed in claim 1, wherein the ultrasonic transducer is detachably mounted to the first side of the flexible connecting frame via screws that are inserted into the first side of the flexible connecting frame.

3. The wire bonding apparatus as claimed in claim 1, wherein the flexible connecting frame comprises at least two pivot points, each of which is located adjacent to an end of the elongated slit.

4. The wire bonding apparatus as claimed in claim 1, wherein a transducer portion of the wire bonding apparatus comprising the ultrasonic transducer and the flexible connecting frame is configured to be detachably mounted to an oscillator portion of the wire bonding apparatus comprising the at least one actuator.

5. A wire bonding apparatus comprising:
an ultrasonic transducer including a capillary;
a flexible connecting frame having a first side to which the ultrasonic transducer is connected;
at least one electrically-driven actuator which is connected to a second side of the flexible connecting frame that is opposite to the first side thereof, the actuator having a longitudinal actuation direction; and
an elongated slit, located in the flexible connecting frame, which extends substantially transversely to the actuation direction of the at least one actuator, an entire length of the elongated slit, which extends substantially transversely to the actuation direction of the at least one actuator, being bounded by planar surfaces of the flexible connecting frame, the planar surfaces of the flexible connecting frame and the elongated slit bounded by the planar surfaces extending through an entire thickness of the flexible connecting frame, a portion of the flexible connecting frame not including the elongated slit being configured to form at least one pivot point adjacent to an end of the slit about which the flexible connecting frame is rotatable when it is driven by the at least one actuator,
wherein a transducer portion of the wire bonding apparatus comprising the ultrasonic transducer and the flexible connecting frame is configured to be detachably mounted to an oscillator portion of the wire bonding apparatus comprising the at least one actuator; and
the transducer portion includes a front base portion having through-holes for receiving the at least one actuator when mounting the oscillator portion to the transducer portion, and the oscillator portion has a rear base portion for attaching it to the front base portion.

6. The wire bonding apparatus as claimed in claim 1, further comprising a base portion to which an end of the actuator that is opposite to the end of the actuator connected to the second side of the flexible connecting frame is connected, the base portion having a higher rigidity than the flexible connecting frame such that the flexible connecting frame is rotatable relative to the base portion.

7. The wire bonding apparatus as claimed in claim 6, further comprising a flexible central beam extending substantially parallel to the actuation direction of the at least one actuator, the central beam being configured to connect the flexible connecting frame to the base portion.

8. The wire bonding apparatus as claimed in claim 7, wherein the at least one actuator comprises a first actuator and a second actuator, the first and second actuators being located on opposite sides of the central beam.

9. A wire bonding apparatus comprising:
an ultrasonic transducer including a capillary;
a flexible connecting frame having a first side to which the ultrasonic transducer is connected;
at least one electrically-driven actuator which is connected to a second side of the flexible connecting frame that is opposite to the first side thereof, the actuator having a longitudinal actuation direction;
an elongated slit, located in the flexible connecting frame, which extends substantially transversely to the actuation direction of the at least one actuator to form at least one pivot point adjacent to an end of the slit about which the flexible connecting frame is rotatable when it is driven by the at least one actuator;
a base portion to which an end of the actuator that is opposite to the end of the actuator connected to the second side of the flexible connecting frame is connected, the base portion having a higher rigidity than the flexible connecting frame such that the flexible connecting frame is rotatable relative to the base portion;
a flexible central beam extending substantially parallel to the actuation direction of the at least one actuator, the central beam being configured to connect the flexible connecting frame to the base portion; and
an additional slit located on the central beam which is connected to a point on the elongated slit, wherein the additional slit is substantially parallel to the actuation direction of the at least one actuator.

10. The wire bonding apparatus as claimed in claim 9, wherein the additional slit separates the central beam into two opposing beams that are further connected to an unseparated flexible beam base on the central beam, such that the flexible beams are operative to rotate when the at least one actuator is driven to oscillate.

11. The wire bonding apparatus as claimed in claim 7, wherein the central beam further comprises a narrowed portion which is formed by a cut-out made on the central beam at an end of the central beam connected to the flexible connecting frame to form a pivot for oscillating motion of the flexible connecting frame that is substantially transverse to the actuation direction of the actuator.

12. A wire bonding apparatus comprising:
an ultrasonic transducer including a capillary;
a flexible connecting frame having a first side to which the ultrasonic transducer is connected;
at least one electrically-driven actuator which is connected to a second side of the flexible connecting frame that is opposite to the first side thereof, the actuator having a longitudinal actuation direction;
an elongated slit, located in the flexible connecting frame, which extends substantially transversely to the actuation direction of the at least one actuator to form at least one pivot point adjacent to an end of the slit about which the flexible connecting frame is rotatable when it is driven by the at least one actuator;
a base portion to which an end of the actuator that is opposite to the end of the actuator connected to the second side of the flexible connecting frame is connected, the base portion having a higher rigidity than the flexible connecting frame such that the flexible connecting frame is rotatable relative to the base portion; and
at least one preload screw that is inserted into the base portion to provide a preload force to the at least one actuator for securely clamping the actuator towards the flexible connecting frame.

13. The wire bonding apparatus as claimed in claim 12, wherein the preload screw has a non-circular head and is inserted into a blind hole in the base portion, and wherein the blind hole is filled with a filling compound which is hardened to restrict rotation of the head of the preload screw that is embedded in the filling compound.

14. The wire bonding apparatus as claimed in claim 6, further comprising at least one preload screw that is inserted into the flexible connecting frame to provide a preload force to the at least one actuator for securely clamping the actuator towards the base portion.

15. The wire bonding apparatus as claimed in claim 6, further comprising a first flexible support connecting the actuator to the flexible connecting frame and a second flexible support connecting the actuator to the base portion, the first and second flexible supports being configured to allow the actuator to be rotatable relative to the base portion.

16. The wire bonding apparatus as claimed in claim 15, further comprising a preload screw that is operative to push the second flexible support towards the actuator to securely clamp the actuator.

17. A wire bonding apparatus comprising:
an ultrasonic transducer including a capillary;
a flexible connecting frame having a first side to which the ultrasonic transducer is connected;
at least one electrically-driven actuator which is connected to a second side of the flexible connecting frame that is opposite to the first side thereof, the actuator having a longitudinal actuation direction;
an elongated slit, located in the flexible connecting frame, which extends substantially transversely to the actuation direction of the at least one actuator to form at least one pivot point adjacent to an end of the slit about which the flexible connecting frame is rotatable when it is driven by the at least one actuator;
a base portion to which an end of the actuator that is opposite to the end of the actuator connected to the second side of the flexible connecting frame is connected, the base portion having a higher rigidity than the flexible connecting frame such that the flexible connecting frame is rotatable relative to the base portion; and
a first flexible support connecting the actuator to the flexible connecting frame and a second flexible support connecting the actuator to the base portion, the first and second flexible supports being configured to allow the actuator to be rotatable relative to the base portion,
wherein the first flexible support comprises a pivotal axis located on a beam connecting a first support base adjacent to the flexible connecting frame and an actuator support adjacent to one end of the actuator.

18. The wire bonding apparatus as claimed in claim 17, wherein the second flexible support comprises a second pivotal axis located on a second beam connecting a second actuator support adjacent to an end of the actuator that is opposite to the end of the actuator adjacent to the first flexible support, and a second support base adjacent to the base portion.

19. The wire bonding apparatus as claimed in claim 18, wherein the second support base further comprises a front flexible portion connected to the second beam, a rear flexible portion connected to the base portion, and a slit located between the front and rear flexible portions, the second support base having a contact surface for the application of a preload force to clamp the second flexible support and the actuator.

20. The wire bonding apparatus as claimed in claim 1, further comprising peripheral slits extending from opposite edges of the flexible connecting frame generally in the direction of the elongated slit so to form pivot points between opposite ends of the elongated slit and corresponding ends of the peripheral slits.

* * * * *